United States Patent [19]

Henschen et al.

[11] Patent Number: 5,010,233
[45] Date of Patent: Apr. 23, 1991

[54] SELF REGULATING TEMPERATURE HEATER AS AN INTEGRAL PART OF A PRINTED CIRCUIT BOARD

[75] Inventors: Homer E. Henschen, Carlisle; Michael J. McKee, New Cumberland; Joseph M. Pawlikowski, Lancaster, all of Pa.

[73] Assignee: AMP Incorporated, Harrisburg, Pa.

[21] Appl. No.: 277,095

[22] Filed: Nov. 29, 1988

[51] Int. Cl.$^5$ .................... H05B 3/12; H05B 6/10
[52] U.S. Cl. .................... 219/209; 219/85.1
[58] Field of Search ............ 219/209, 229, 388, 210, 219/85.1, 85.16, 85.22; 228/123, 180.1, 180.2, 264

[56] References Cited

U.S. PATENT DOCUMENTS

| | | | |
|---|---|---|---|
| 3,289,046 | 11/1966 | Carr | 219/85.1 |
| 3,396,894 | 8/1968 | Ellis | 228/56 |
| 3,470,611 | 10/1969 | McIver et al. | 228/180.2 |
| 3,713,575 | 1/1973 | Cushman | 228/180.2 |
| 3,717,742 | 2/1973 | Fottler | 228/180.2 |
| 3,719,981 | 3/1973 | Steitz | 29/423 |
| 3,750,252 | 8/1973 | Landman | 29/191.6 |
| 4,256,945 | 3/1981 | Carter | 219/10.75 |
| 4,354,629 | 10/1982 | Grassauer | 228/56 |
| 4,484,704 | 11/1984 | Grassauer | 228/180 |
| 4,574,182 | 3/1986 | Pescatore et al. | 219/388 |
| 4,623,401 | 11/1986 | Derbyshire | 148/13 |
| 4,626,767 | 12/1986 | Clappier | 323/280 |
| 4,659,912 | 4/1987 | Derbyshire | 219/535 |
| 4,695,713 | 9/1987 | Krumme | 219/553 |
| 4,701,587 | 10/1987 | Carter | 219/10.75 |
| 4,717,814 | 1/1988 | Krumme | 219/553 |
| 4,745,264 | 5/1988 | Carter | 219/553 |
| 4,769,525 | 9/1988 | Leatham | 219/209 |
| 4,788,404 | 11/1988 | Kent | 219/209 |
| 4,789,767 | 12/1988 | Doljack | 219/9.5 |
| 4,914,267 | 4/1990 | Derbyshire | 219/85.1 |

FOREIGN PATENT DOCUMENTS

| | | |
|---|---|---|
| 0158434 | 10/1985 | European Pat. Off. |
| 0206620 | 12/1986 | European Pat. Off. |
| 0241597 | 10/1987 | European Pat. Off. |
| 0250094 | 12/1987 | European Pat. Off. |

*Primary Examiner*—Geoffrey S. Evans
*Attorney, Agent, or Firm*—David L. Smith

[57] ABSTRACT

A heater (20,40,50,70,80) is secured to or embedded in a circuit board (10,30,75,86) and is selectively energizable by current to melt solder in a connection or disconnection operation. The heater is spaced from circuit board contact pads (13,34) by circuit board structure material that transmits the generated thermal energy to the contact pads to melt solder or other fusible material. The heater is a self-regulating heater in the form of a copper substrate having a thin surface layer of magnetically permeable, high resistance material. An alternating current of constant amplitude and high frequency is passed through the heater and concentrated in the surface layer at temperatures below the surface layer Curie temperature. At higher temperatures the current is distributed through the lower resistance substrate to limit further heating. A current return path (21,43,53,73,85) or bus is disposed in closely-spaced parallel relation to the surface layer and establishes an electric field between the substrate and the return bus to bias current in the substrate toward the surface layer. The return bus may be embedded in the circuit board or provided as part of external tooling employed to deliver energizing current.

19 Claims, 4 Drawing Sheets

SELF REGULATING TEMPERATURE HEATER AS AN INTEGRAL PART OF A PRINTED CIRCUIT BOARD

BACKGROUND OF THE INVENTION

The present invention relates to an improved method and apparatus for electrically connecting and disconnecting contact pads or traces on a circuit board to and from external leads. More particularly, the present invention relates to improvements in positioning and utilizing self-regulating heaters to effect electrical connections and disconnections at circuit pads on a circuit board.

Although the invention has as its primary utility the simultaneous joining of a plurality of electrical leads to a plurality of circuit board contacts, it will be appreciated that the principles described herein are equally applicable to joining a single lead to a single contact. Moreover, although the description set forth below mentions solder as the joining material, it is to be understood that any fusible material, such as doped conductive plastic material, may be employed.

Soldering cable leads to circuit board contact pads can be achieved in a variety of prior art methods and apparatus. The least desirable of these is manually effecting each of the multiple solder terminations; that is, the resulting repetitive soldering operations are time-consuming and costly. In addition, close spacing between adjacent connection sites renders it likely that one or more of the manual soldering operations will result in solder bridges between one or more pairs of the adjacent sites.

There have been a number of prior art attempts to solve the aforementioned problems, examples of which may be found in U.S. Pat. No. 3,396,894 (Ellis), U.S. Pat. No. 3,719,981 (Steitz), U.S. Pat. No. 3,750,252 (Landman) and U.S. Pat. No. 4,484,704 (Grassauer et al). Typically, in these and other prior art soldering procedures for forming multiple solder joints simultaneously, a soldering tool is moved to the connection sites to deliver the necessary thermal energy over a large continuous area spanning all of the connection sites. Upon energization, the soldering tool heats up until it overshoots a control temperature before settling down to that temperature. The control temperature is typically chosen somewhat above the ideal soldering temperature in order to compensate for less than ideal thermal energy transfer. This approach to thermal energy delivery has a number of disadvantages. One such disadvantage is damage to components resulting from overheating. For example, the thermal overshoot inherent in the heating tool can damage components disposed between the connection sites within the area heated by the tool. In some cases the overshoot may cause damage to the polymeric materials, insulating materials and adhesives at the connection site.

Another prior art problem associated with the simultaneous soldering of sets of plural contacts relates to solder bridging between the connection sites. The pressure and thermal energy applied to spaces between the connection sites tends to cause the solder to run between those sites and form solder bridges. This problem has been addressed in some prior art apparatus such as that disclosed in the aforementioned Grassauer et al patent. In that apparatus the solder is sandwiched between two layers of polymeric material, one of which has window openings arranged to permit the solder, when melted, to flow through to respective connection sites. Barriers are provided between the windows to preclude solder bridging. While this technique, when properly employed, minimizes bridging, proper employment is hampered by the difficulty of aligning the windows (which must necessarily face downward and away from the technician) with respective contact pads at the connection sites. Care must also be taken to avoid displacement of the solder within the layered polymeric package prior to heating the apparatus in order to assure that solder is present at each of the window openings.

Connectors having terminals with solder tails extending therefrom for reception in plated through holes of a circuit board are well known. Relatively recently, in the interests of facilitating automated contact placement and economy of circuit board manufacture, surface mount connectors have been developed with terminals having solder tails formed for disposition against respective plated contact pads on the surface of the board. The terminals are typically fixed in the connector housing, and the tails are formed to sufficient length to assure compliance with the pad or pads, regardless of any tendency of the board to warp. Typically, each solder tail is individually manually soldered to a respective contact pad by any of a variety of known techniques. The repetitive soldering operations are both time-consuming and costly.

Another problem associated with prior art techniques for simultaneously joining multiple solder tails of a surface mount connector to respective contact pads on a printed circuit board relates to positionally aligning of the components during soldering. It is not only necessary for the multiple solder tails to be positionally aligned with respective multiple contact pads on the printed circuit board surface; in addition, the solder tails and contact pads must be simultaneously aligned with multiple respective sections of the solder delivery unit. The resulting alignment procedure is often unwieldy at best.

It is desirable, therefore, to provide a method and apparatus for electrically joining contact pads of a circuit board to respective leads in a cable or solder tails of a surface mount connector without a third component to be aligned at each connection site. In addition, it is desirable that the thermal energy required to melt the fusible material (e.g., solder) be available virtually instantaneously after energization of the heater, and that the heater be arranged to provide no more thermal energy than is required to melt the solder at the various connection sites. It is also desirable that the heater be simple and convenient to employ and energize, and that it have a relatively low mass in order that the heater may cool quickly after a soldering operation. It is likewise desirable that the method and apparatus provide the thermal energy to a localized area in which the connection sites are located.

The present invention makes use of a relatively new automatic self-regulating heater technology disclosed in U.S. Pat. No. 4,256,945 (Carter et al), U.S. Pat. No. 4,623,401 (Derbyshire et al), U.S. Pat. No. 4,659,912 (Derbyshire), U.S. Pat. No. 4,695,713 (Krumme), U.S. Pat. No. 4,701,587 (Carter et al), U.S. Pat. No. 4,717,814 (Krumme) and U.S. Pat. No. 4,745,264 (Carter). The disclosures in these patents are expressly incorporated herein by reference for purposes of background information. A heater constructed in accordance with that technology, referred to herein as a self-regulating heater, employs a substrate of copper, copper alloy, or other material of low electrical resistivity, negligible magnetic permeability and high thermal conductivity. A thin layer of thermally-conductive magnetic material is deposited on all or part of one surface of the substrate, the layer material typically being an iron, nickel or nickel-iron alloy, or the like, having a much higher electrical resistance and magnetic permeability than the substrate material. The thickness of the layer is approximately one skin depth, based on the frequency of the energizing current and the permeability and resistance of the layer. A constant amplitude, high frequency alternating energizing current is passed through the heater and, as a result of the skin effect phenomenon, is initially concentrated in one skin depth corresponding to the thickness of the magnetic surface layer material When the temperature at any point along the heater reaches the Curie temperature of the magnetic material, the magnetic permeability of the magnetic material at that point decreases dramatically, thereby significantly increasing the skin depth so that the current density profile expands into the non-magnetic substrate of low resistivity. The overall result is a lower resistance and lesser heat dissipation. If thermal sinks or loads are placed in contact with the heater at different locations along the heater length, thermal energy is transferred to the loads at those locations with the result that the temperature does not rise to the alloy Curie temperature as quickly at those locations as it does in the non-load locations. The constant amplitude current remains concentrated in the higher resistance alloy layer at the load locations which dissipate considerably more resistive heating energy than it dissipated in the non-load locations where the current is distributed in the low resistance substrate.

The aforementioned self-regulating heater technology is described in connection with soldering a in co-pending U.S. Patent Applications Ser. No. 277,116 filed by McKee, et al. and entitled "Self Regulating Temperature Heater with Thermally Conductive Extensions'; and U.S. Patent Application Ser. No. 277,362 filed by McKee, et al. and entitled "Surface Mount Technology Breakaway Self Regulating Temperature Heater'; both filed concurrently herewith and owned by the same assignee as the present patent application. The disclosures in both of those patent applications are expressly incorporated herein by reference. In patent application Ser. No. 277,116 a self-regulating heater is disclosed as having a plurality of thermally and electrically conductive connecting members formed integrally therewith and adapted to be disposed, at respective connection sites, between circuit board contact pads and leads to be soldered to that pad. The connecting members are severed from the heater assembly after a soldering operation, and remain permanent components of each connection site. In patent application Ser. No. 277,362 a self-regulating heater has the terminals of a surface mount connector formed integrally therewith, the terminals being configured to have solder tail portions adapted to contact respective pads on a circuit board. After a soldering operation the terminals are severed from the heater. Although the heaters disclosed in these two patent applications function well for their intended purposes, neither is conveniently useful for applying thermal energy to unsolder or remove connections from a circuit board.

It is therefore desirable to provide a method and apparatus for connecting and disconnecting circuit board contact pads to external leads and terminals whereby a self-regulating heater may be employed for both connecting (i.e., soldering) and disconnecting (i.e., unsoldering) applications. Moreover, it is desirable to provide a method and apparatus for effecting electrical connections and disconnections at circuit board contact pads wherein a heater for generating thermal energy to melt solder or other fusible material is a permanent part of the circuit board structure.

SUMMARY OF THE INVENTION

In accordance with the present invention an actuable self-regulating heater is constructed as part of a circuit board to permit generation of thermal energy as required at different board locations to melt solder or other fusible material In one embodiment the substrate for the self-regulating heater constitutes the copper (or similar metal) backplane of a circuit board and has a magnetic surface layer at selected locations corresponding to contact pads on the front surface of the board. External tooling includes a return bus that may be positioned in spaced parallel adjacency with the surface layer portions. Alternatively, the heater substrate and its magnetic surface layer may be deposited only at selected locations on one side of the board corresponding to contact pad locations on the opposite side. The heater may also be embedded in a multi-layer circuit board at locations corresponding to those requiring thermal energy for soldering at adjacent board layers. Connections to supply energizing current to embedded heaters extend through various layers from an exposed board surface. The embedded heaters may operate with external return bus tooling or may have a return bus similarly embedded in the board.

BRIEF DESCRIPTION OF THE DRAWINGS

Specific embodiments of the present invention are illustrated in the accompanying drawings wherein like reference numerals in the various figures are utilized to designate like components, and wherein.

DESCRIPTION OF THE PREFERRED EMBODIMENTS

Figures 1, 2:
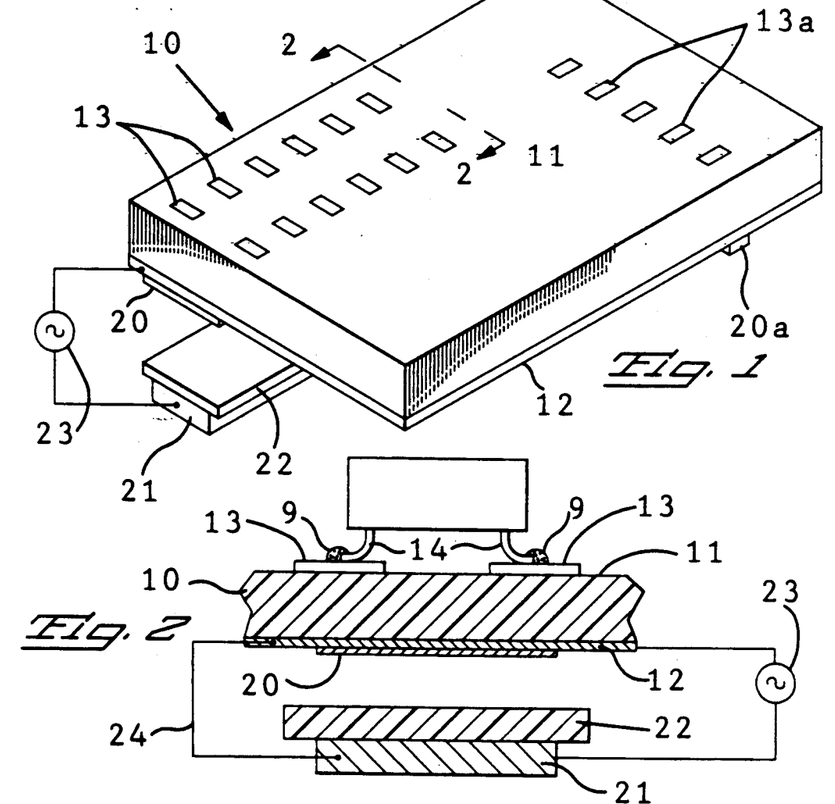
FIG. 1 is a view in perspective of one embodiment of the present invention wherein a circuit board has a self-regulating heater mounted on one surface thereof.
FIG. 2 is a sectional view in elevation taken along lines 2—2 of FIG. 1 and showing a surface mount connector positioned to be soldered to contact the circuit board.

Referring specifically to FIGS. 1 and 2 of the accompanying drawings, a circuit board 10 has a top surface 11 and a bottom surface entirely covered by a substrate 12. Substrate 12 is composed of copper, copper alloy, phosphor bronze, beryllium copper, brass or other material having a high electrical conductivity (i.e., low resistivity) and negligible magnetic permeability (i.e., a permeability at, or close to, one). The substrate material must also be a good thermal conductor. In this embodiment, wherein substrate 12 covers the entire bottom surface of the circuit board, the length and width of the substrate are determined by the corresponding board dimensions. The depth of the substrate may be dictated by circuit board structural requirements; however, for purposes of heater function, the depth of the substrate need only be on the order of a few thousands of an inch and may be applied using known techniques.

A plurality of contact pads or traces 13 are disposed in a conventional manner on the top surface 11 of circuit board 10. Traces 13 are arranged in two mutually spaced longitudinal rows wherein the traces are positioned to correspond to the positions of two rows of solder tails 14 of a surface mount connector 15. Another set of traces 13a is positioned at another portion of top surface 11 of the circuit board and arranged in a row so as to be connected, for example, to wires or leads of a cable. The pads or traces are interconnected with other components on the board as is known in the art.

In order to form a self-regulating heater, a thermally-conductive surface layer 20 of magnetic material is deposited or otherwise affixed to a portion of the exposed surface of substrate 12 located at a position adapted to be opposed to or in registration with the two rows of contact pads 13 at top surface 11. Typically a roll cladding process is used where the magnetic material layer of a few thousandths of an inch is laid over the substrate then subjected to high pressure and temperature which diffuses the two materials together at the boundary layer, but other processes such as plating or sputter depositing could be used. The substrate of this clad material is then bonded to the under surface of board 10 using known methods. A similar surface layer 20a is affixed to the same surface of substrate 12 but in registration with the row of contact pads 13a to define a second self-regulating heater. The two self-regulating heaters may be individually or simultaneously energized, as desired. The following description of the characteristics of surface layer 20 is intended to apply to surface layer 20a.

A typical material for surface layer 20 is nickel, iron or a nickel-iron alloy, such as Alloy 42 (forty-two percent nickel, fifty-eight percent iron) or Alloy 42-6 (forty-two percent nickel, six percent chromium, fifty-two percent iron); however, layer 13 may be any metal or alloy having the characteristics described herein. Depending upon the particular material, magnetic permeabilities for surface layer 20 range from fifty to more than one thousand, as compared to a permeability of one for copper; typical electrical resistivities range from twenty to ninety micro-ohms per centimeter as compared to 1.72 for copper. The thickness of surface layer 20 is typically one skin depth. In this regard, substrate 12 and surface layer 20, when energized by passing a constant amplitude alternating current therethrough, function as a self-regulating heater. Specifically, for temperatures below the Curie temperature of the surface layer material, slightly more than sixty-three percent of the constant amplitude current flowing through the heater is concentrated in one skin depth from the heater surface. The skin depth is proportional to the square root of the material resistivity, and is inversely proportional to the square root of the product of the magnetic permeability of surface layer 20 and the frequency of the alternating current passing through the heater. For temperatures equal to or above the Curie temperature of the surface layer, the magnetic permeability of the material drops to approximately that of the substrate material (i.e., a permeability of one, for copper), thereby producing a dramatic increase in the skin depth. Consequently, much more of the constant amplitude current is distributed in the lower resistivity substrate 12 than in the higher resistivity surface layer 20, with the result that considerably less heat is dissipated. If selected locations of the heater body are in contact with thermal energy absorptive loads (e.g., heat sinks), then the temperature at those locations of the heater body does not rise as readily as it does at the non-load locations. It is possible, therefore, for the constant amplitude current to be concentrated in layer 13 to a greater extent at the load locations (where the temperature is below the Curie temperature for surface layer 20) than at the non-load locations (where the temperature is equal to the Curie temperature of the surface layer material). Curie temperatures for materials can range from 50° to 1,000° C.; typical materials employed for surface layer 20 have Curie temperatures in the range of 200° C. to 500° C., depending upon the solder or other fusing material employed A typical solder is 63 percent tin with the balance being lead, having a melting point of 183° C.

In order to actuate the heater associated with surface layer 20, a tooling assembly is employed and comprises a conductive bus bar layer 21 and a superposed layer 22 of electrically insulative material. The bus bar layer 21 is typically copper and has dimensions similar to those of surface layer 20. Insulative layer 22 is typically Kapton and is slightly larger in length and width than the corresponding surface layer dimensions; the thickness of layer 22 is of the same order of magnitude as that of the substrate. When it is desired to energize the heater, the tooling assembly is positioned flush against the heater with the exposed surface of insulative layer 22 abutting surface layer 20 of the heater. The heater and tooling assembly may be held together by clamps or other suitable means while the heater is energized.

As best illustrated in FIG. 1, a source 23 of constant amplitude alternating current is connected across the heater (at substrate 12) and the tooling assembly (at bus bar 21) at one longitudinal end of the heater. Source 23 may be any suitable constant amplitude alternating current supply such as, for example, the source disclosed in U.S. Pat. No. 4,626,767 (Clappier et al) and provides a constant amplitude alternating signal, typically in the radio frequency range. Most commonly, the frequency of the actuating signal is 13.56 MHz. The constant amplitude of the signal is selected to provide the desired heating level. An impedance matching circuit is generally provided to match the impedance of the heater-tooling combination to the source impedance.

At the end of the heater section located longitudinally remote from the connection to source 23, there is a short circuit connection 24 (FIG. 2) interconnecting substrate 12 and bus bar 21. For example, the short circuit 24 may be a copper strap positioned on the tooling to electrically connect the substrate to the bus bar when the tooling assembly is placed adjacent the heater. Current flow at any instant of time is in longitudinally opposite directions in substrate 12 and bus bar 21. A resulting electric field is established between the substrate and the bus bar across the insulation layer 22, thereby concentrating the current flowing through the heater in the high resistance surface layer 20 rather than in the lower resistance substrate. The current flowing through bus bar 21 is similarly concentrated at the surface facing the surface layer 20. Since the current amplitude is maintained constant, it is desirable, for optimal heating, to concentrate the current in the higher resistance layer 20 of the heater than in the lower resistance substrate 12. That is, the resistive heating, with the current maintained constant, is greater when the current path has greater resistance. The electric field developed by the oppositely-directed current flowing in the heater and bus bar assures that the current in the heater is concentrated in the high resistance surface layer of the heater assembly facing the bus bar.

Thermal energy generated by resistance heating in surface layer 20 is conducted via the substrate 12 and the structure material of circuit board 10 to the contact pads 13 at the top surface of the circuit board. The nature of the self-regulating heater is such that the resistance heating is produced only where it is needed to effect soldering operations. More specifically, current through the heater flows longitudinally (i.e., into and out of the plane of the drawing in FIG. 2) and thereby encounters regions relatively proximate contact pads 13 and regions relatively remote from the contact pads. Thermal energy developed in regions proximate the contact pads is conducted to respective connection sites by the structure material of circuit board 10, thereby preventing the temperature at those regions from building up quickly. On the other hand, in the regions relatively remote from the contact pads, the temperature increases rapidly until it reaches the Curie temperature of the surface layer material, whereupon the effective skin depth is increased in those regions. This causes more current to flow through the low resistance substrate material in these regions and, as a consequence, less thermal energy is produced therein. The regions located proximate the contact pads continue to develop high amounts of thermal energy that is transmitted to the respective connection sites through the circuit board structure material. Overheating of the connection sites is prevented by the same mechanism; that is, once the temperature at a connection site reaches a certain level, thermal conduction from the heater to the site ceases, thereby removing the heat sink effect of the connection site. The thermal energy developed by current flowing in the high resistance surface layer 20 then quickly increases the temperature at heater locations proximate the connection site until the Curie temperature of the surface layer material is reached. Eventually the effective skin depth along the entire length of the heater is increased so that more of the constant amplitude current flows through the low resistance substrate 12 and significantly less thermal energy is produced by resistive heating. After current is removed from the heater assembly, the assembly begins to cool and the solder 9, or other fusible material, at the connection sites is permitted to harden. The cooling proceeds quickly because the relatively low mass of the heater does not retain its heat for long periods of time. The tooling assembly, including the return bus 21, insulation layer 22, source 23 and short circuit 24, may be removed from the heater at any time after current flow is terminated.

The self-regulating heater composed of substrate 12 and surface layer section 20a may operate with the same or different tooling components used for the heater composed of substrate 12 and surface layer section 20. In either case, operation is the same as described above for the heater comprised of substrate 12 and heater section 20.

Figure 3:
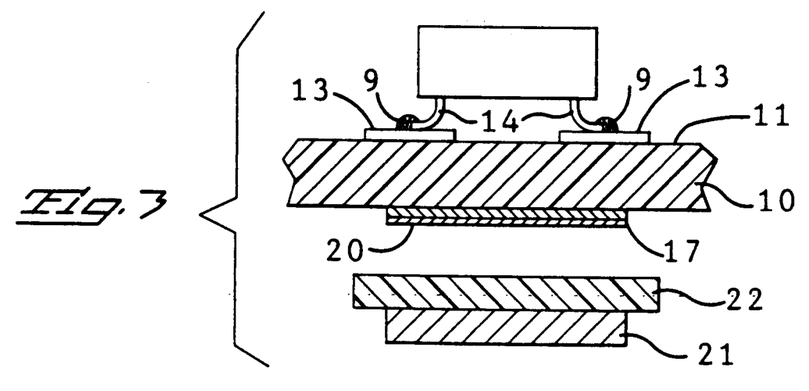
FIG. 3 is an sectional view in elevation similar to FIG. 2 but of a modified version of the embodiment of FIG. 1.

The self-regulating heater assembly need not have a substrate that covers the entire bottom surface of the circuit board. For example, a substrate may be disposed only on those areas of the underside of the board that are opposed to or in registration with the connection sites. An example of an embodiment of this type is illustrated in FIG. 3 wherein substrate 17 is disposed in registration with contact pads 13. Surface layer 20 is disposed over the entire exposed surface of the substrate. In all other respects the embodiment illustrated in FIG. 3 is the same as the embodiment illustrated in FIGS. 1 and 2 and operates in the same manner. It will be appreciated that substrate 17 and its surface layer 20 can be configured to extend into registration with contact pads 13a (FIG. 1) and any other connection sites on the circuit board so that a single heater can be energized to simultaneously effect soldering at all connection sites on the board. Likewise, when a substrate 12 (FIGS. 1 and 2) comprising the entire underside of the board is employed, a single surface layer 20 may be configured to register with all contact sites to be simultaneously heated.

Circuit board 10 is composed of any material conventionally employed for circuit board structures. The material must provide the necessary structural support and must be electrically non-conductive. In addition, the structure material must transmit thermal energy from the heater to the connection sites over at least the short distances required by the present invention. Examples of suitable materials are ceramic, glass, glass epoxy and various phenolic materials.

Figure 4:
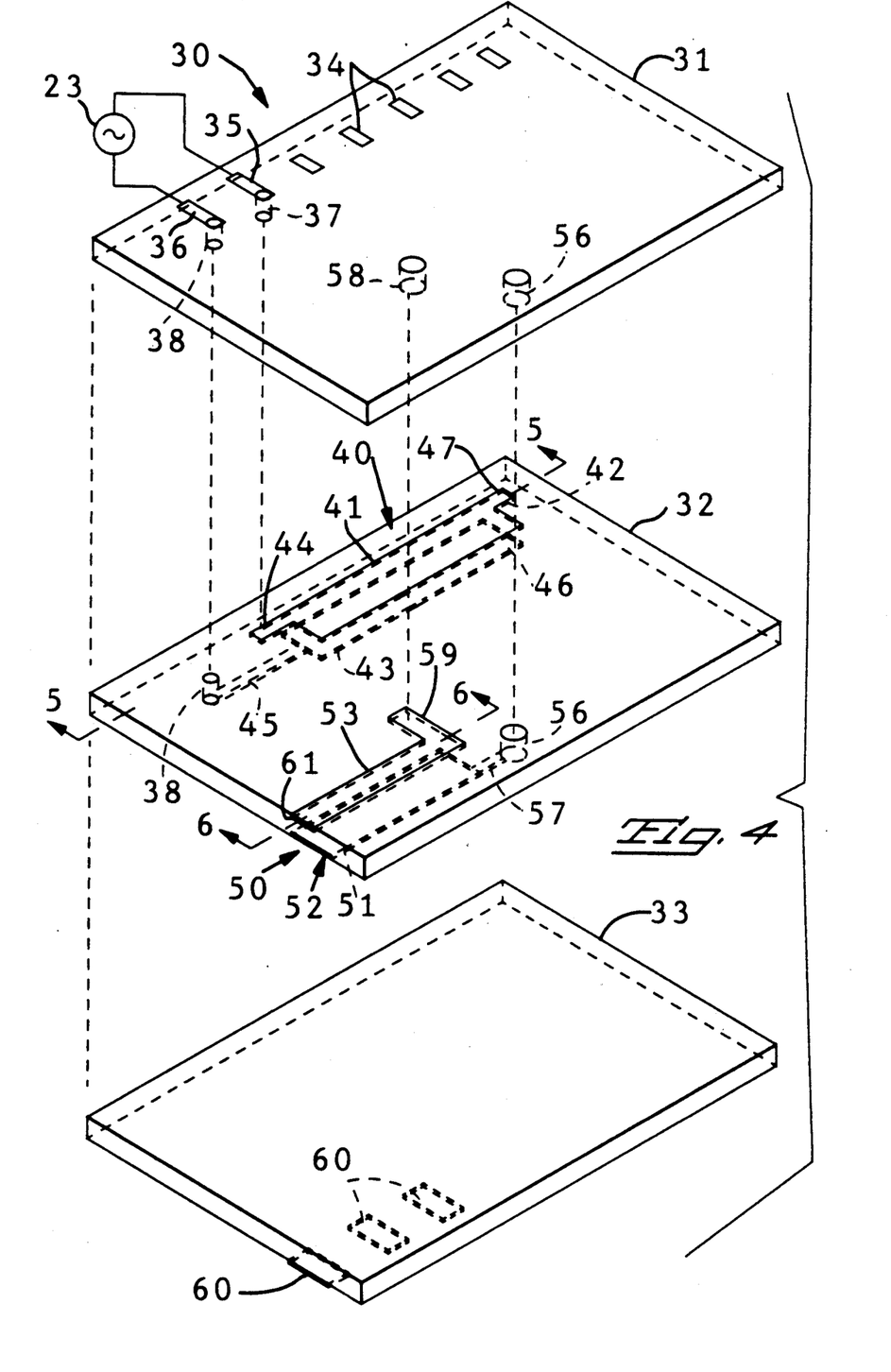
FIG. 4 is an exploded view in perspective of another embodiment of the present invention in which a multi-layer circuit board has a plurality of self-regulating heaters embedded therein.
Figure 5:
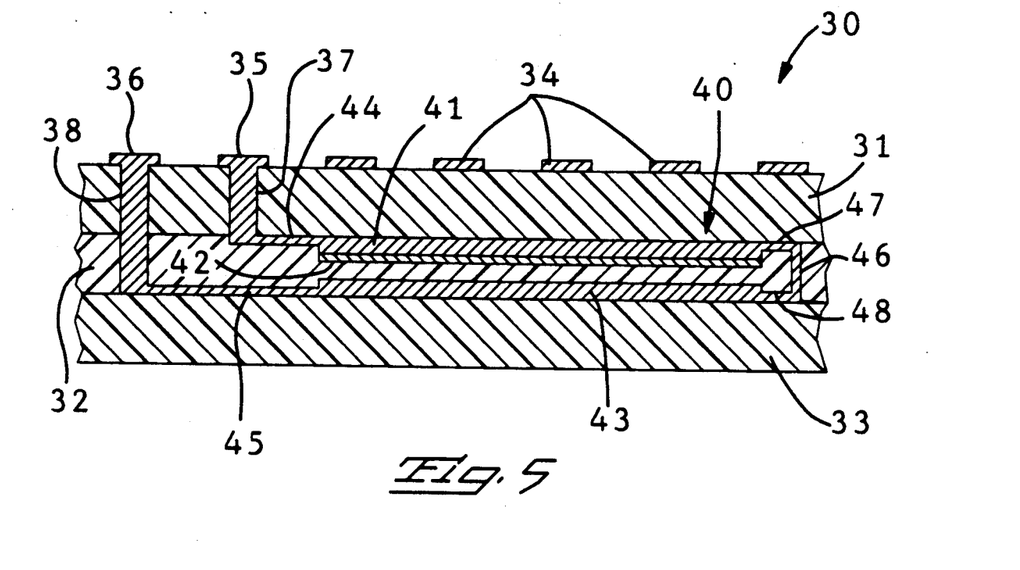
FIG. 5 is an sectional view in elevation taken along lines 5—5 of FIG. 4.

In accordance with the present invention, a self-regulating heater may also be embedded in a multi-layer circuit board and selectively energized to generate thermal energy for melting solder or other fusible material at one or more connection sites on the board. With references to FIGS. 4, 5 and 6 of the accompanying drawings, a multi-layer circuit board assembly 30 includes a top layer 31, an intermediate layer 32 and a bottom layer 33 sandwiched together in a stack. Adjacent layers are secured to one another in a conventional manner, such as by adhesive, ultrasonic welding, screws, etc., and the material used for the individual layers is the same as the structure material described above as used for circuit board 10 in FIG. 1. With particular reference to FIGS. 4 and 5, a plurality of contact pads or traces 34 are spaced in a longitudinally-extending row at the top surface of upper board layer 31. The top surface of intermediate board layer 32 has a recess defined therein in an area aligned in depthwise registration with the row of contact pads on upper board layer 31. Disposed and secured in that recess is a self-regulating heater 40 including a substrate 41 and surface layer 42 having the same thermal, electrical and magnetic properties as substrate 12 and surface layer 20, respectively, of FIG. 1. The length and width dimension of heater 40 are the same as those of the recess in which it resides and are determined by the area encompassed by the row of contact pads 34. The underside of intermediate board layer 32 is also provided with a recess in which a return bus 43 of conductive material (e.g., copper) is disposed. The return bus 43 and its retaining recess are aligned depthwise with heater 40 and its retaining recess. Heater 40 is oriented such that surface layer 42 is parallel to and closely spaced from return bus 43 across the intervening structure material of intermediate board layer 32. The opposite surface of heater 40 (i.e., the top surface of substrate 41) is flush with the top surface of intermediate board layer 32 and abuts the underside of top board layer 31. Substrate 41 is typically a few thousandths of an inch thick. The thickness of the surface layer 42 is approximately one skin depth of the surface layer material at the frequency of the energizing signal for the heater. Return bus 43 is disposed in its recess such that the bottom surface of the return bus is flush with the bottom surface of intermediate board layer 32 and abuts the top surface of bottom board layer 33.

At one end of the row of contact pads 34 there are two terminals 35, 36 affixed to the top surface of the top board layer 31. Terminals 35, 36 are adapted to be connected to respective opposite sides of a source 23 of constant amplitude alternating energizing current. Terminals 35, 36 are connected to the heater 40 and return bus 43, respectively, at one end of the heater by any conventional electrically-conductive means extending depthwise into the structure. For example, terminal 35 is illustrated as comprising the upper end of a conductive post or pin 37 extending through the entire thickness of upper board layer 31 into contact with a contact trace 44 or similar conductive strip disposed at the top surface of intermediate board layer 32 and extending into direct electrically-conductive contact with one end of heater substrate 41. Terminal 36 is illustrated as comprising the upper end of a conductive post or pin 38 extending through the entire thickness of upper board layer 31 and intermediate board layer 32 into contact with a contact trace 45 or similar conductive strip disposed at the bottom surface of intermediate board layer 32 and extending into direct electrically-conductive contact with the same end of return bus 43. The opposite ends of the heater and return bus are electrically connected together by any suitable means such as a pin or post 46 extending through the thickness of intermediate board layer 32 into contact with respective traces 47, 48, or the like, extending from the heater 40 and return bus 43 at respective surfaces of the intermediate board layer.

When source 23 is connected across terminals 35, 36, the resulting current is, at any instant of time, oppositely directed through heater 40 and return bus 43. As a consequence of the oppositely directed currents, an electric field is established across the heater and return bus, the field serving to concentrate heater current at the surface facing the return bus (i.e., the surface clad with surface layer 42). Thermal energy is generated in the manner described above in relation to FIGS. 1 and 2 and is transmitted to the connection sites at contact pads 34 from substrate 41 through the intervening structure material of upper board layer 31.

Figure 6:
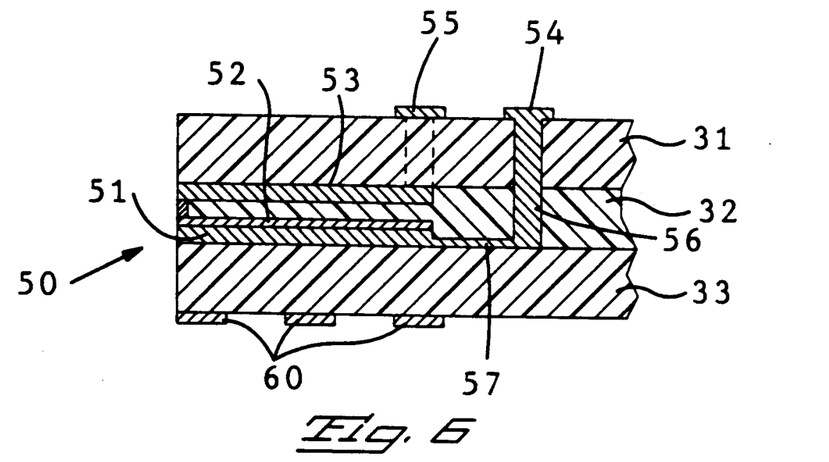
FIG. 6 is an sectional view in elevation taken along lines 6—6 of FIG. 4.

It is possible to provide thermal energy for melting solder at contact pads 60 constituting connection sites located on the underside of bottom board layer 33. Referring to FIGS. 4 and 6, a second self-regulating heater 50 is aligned depthwise with the area encompassed by contact pads 60 and disposed in an appropriately defined recess in the bottom surface of intermediate board layer 32. Heater 50 includes a substrate 51 with its magnetic surface layer 52 facing away from contact pads 60. A return bus 53 is disposed in a suitable recess in the top surface of intermediate board layer 32 in depthwise alignment with heater 50. Terminals 54, 55, disposed at the top surface of upper board layer 31, are adapted to be connected to opposite sides of energizing current source 23. Terminal 54 is electrically connected to one end of heater 50 by a conductive post or pin 56 extending depthwise through the entire thickness of board layers 31 and 32 into contact with a circuit trace 57, or the like, at the bottom surface of intermediate board layer 32. Trace 57 is in direct electrical contact with substrate 51. A similar post or pin 58 extends from terminal 55 through the thickness of upper board layer 31 into contact with circuit trace 59 at the top surface of intermediate board layer 32. Trace 59 is in electrical contact with one end of return bus 53 corresponding to the aforesaid one end of heater 50. The opposite ends of heater 50 and bus 53 are connected together, such as by a connective strip 61. Heater 50 functions in the manner described above in relation to heater 40.

Figure 7:
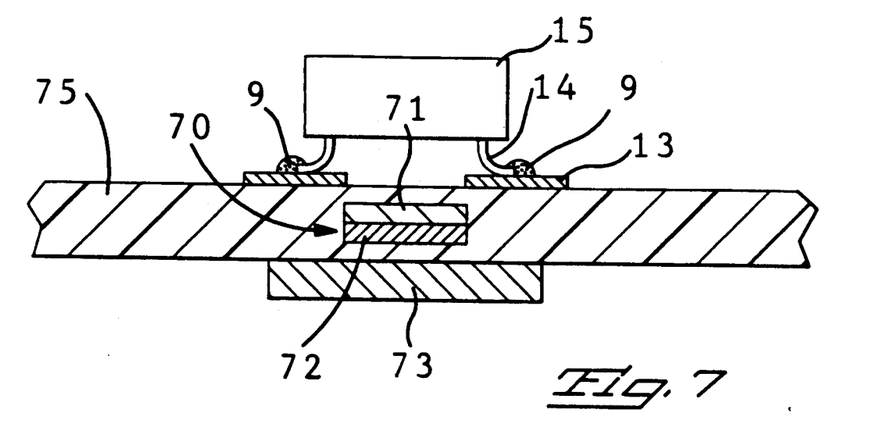
FIG. 7 is an sectional view in elevation of another embodiment of the present invention wherein a self-regulating heater is embedded in a circuit board and illustrating a surface mount connector positioned to be soldered to circuit board contact pads.

In the embodiment illustrated in FIG. 7, a heater 70 comprising substrate 71 and magnetic surface layer 72 is embedded in the circuit board 75. Contact pads 13, disposed on the top surface of the board, are positioned to be soldered to respective solder tails 14 of surface mount connector 15. Instead of embedding the return bus in circuit board 75, return bus 73 is secured to, or substantially movable into flush abutting contact with, the underside of the board. The magnetic surface layer 72 of the heater faces the return bus 73 in parallel closely-spaced relation across the structure material of circuit board 75. Embedded heater 70 functions with external return bus 73 in the same manner described above for the embedded heaters illustrated in FIGS. 4, 5 and 6. An exposed terminal (not shown) on the circuit board permits one side of an energizing source to be connected to heater 70, the other side being connected to return bus 75. A connection (also not shown) between the heater 70 and return bus 73 may be entirely embedded in the board, or may include an exposed terminal at a board surface to which an external wire, or the like, may be connected for shorting the heater to the return bus.

Figure 8:
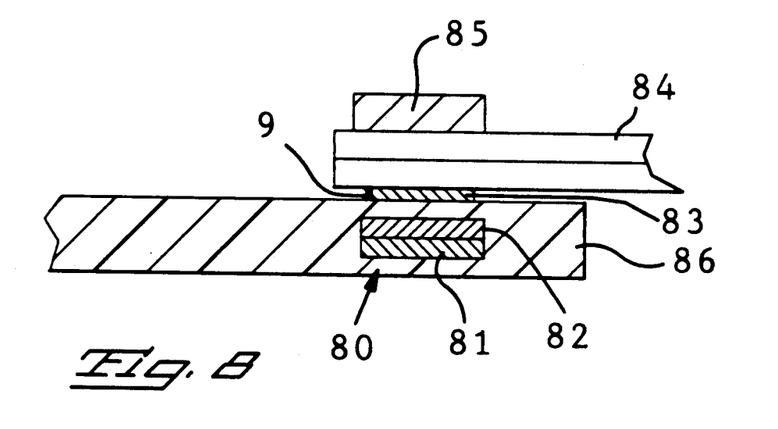
FIG. 8 is a sectional view in elevation of another embodiment of the present invention wherein a self-regulating heater is embedded in a circuit board to which a flexible etched cable is positioned to be soldered to circuit board contact pads.

FIG. 8 is an illustration of an embodiment in which conductors in a flexible etched cable 84 are soldered or otherwise fused to respective contact pads 83 on a circuit board 86. The embedded heater 80 includes a substrate 81 with its magnetic surface layer 82 aligned with contact pads 83 in spaced relation. Surface layer 82 faces the contact pads and is separated therefrom by the electrically-insulative structure material of board 86. To effect soldering, the conductors of cable 84 are disposed on respective contact pads 83, and an external return bus 85 is disposed on the cable so that the connection site, including the contact pad and cable conductor, is disposed between the heater 80 and the return bus. A constant amplitude alternating current energizing source (not shown) is connected between corresponding ends of the heater and return bus, respectively, as described above. Likewise, a short circuit (not shown) is connected between the opposite ends of the heater and return bus. Operation proceeds in the manner described above to provide the energy required to melt the solder or other fusible material at the connection sites.

Figure 9:
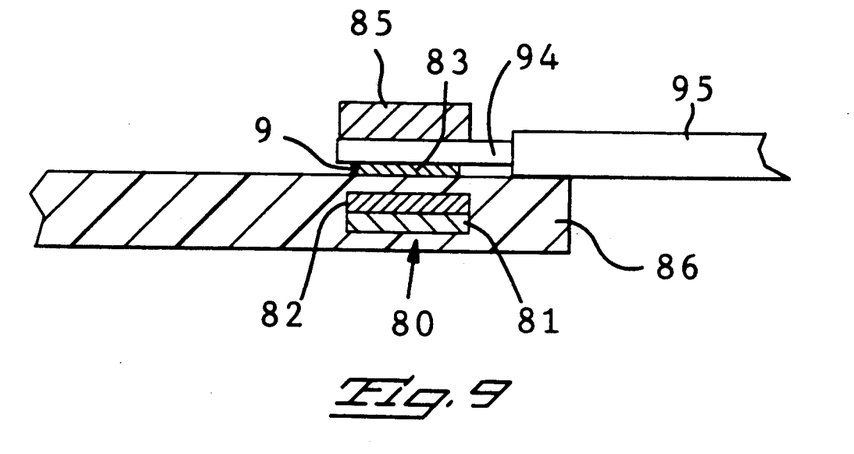
FIG. 9 is a sectional view in elevation of still another embodiment of the present invention wherein a self-regulating heater is embedded in a circuit board and a multi-conductor cable is positioned to be soldered to contact pads on a surface of the circuit board.

The embodiment illustrated in FIG. 9 is identical to that illustrated in FIG. 8 except that an individual lead or conductor 94 is shown being soldered to contact pad 83 rather than the flexible etched cable 84 of FIG. 8. Conductor 94 is provided with an insulation sleeve 95 throughout most of its length, the sleeve being stripped at one end of the lead to permit the required electrical contact at the connection site. Lead 94 may be part of a multi-conductor cable or it may be a single lead.

In the embodiments described above in which the heater is embedded in the circuit board, it is to be understood that the heater body may be inserted into preformed recesses at a board surface; alternatively, the substrate and magnetic surface layer of the heater may be formed by deposition, or similar technique, during the fabrication of the board structure. In other words, any technique for embedding the heater in the board material is considered to fall within the scope of the present invention. Likewise, although the preferred embodiment of the present invention utilizes the board structure material as the necessary electrical insulation between the heater and the return bus, other approaches to providing such insulation may be utilized. For example, the heater may be embedded in the underside of the same board layer having contacts defining connection sites at its top surface; thin insulative paper, or the like, would then be placed between the heater and a return bus embedded in the top surface of the board layer disposed immediately below the first-mentioned board layer. A heater may be energized by induction.

It is also to be understood that the contacts defining connection sites requiring thermal energy for soldering, or the like, need not necessarily be disposed at an exposed surface of a circuit board, depending upon the nature of the structure in which a heater is embodied or to which the heater is secured. A common heater may be used to heat all of the contacts in the structure requiring soldering/unsoldering; alternatively, individual heaters may be selectively energized to effect soldering or unsoldering at different groups of connection sites.

The particular illustration of three board layers in FIGS. 4, 5 and 6 is not to be construed as limiting the scope of the present invention; rather, any number of board layers may be employed with heaters embedded at different depths or secured to an exposed surface.

As described above, the connection sites are most efficiently heated to the soldering temperature by automatic self-regulating heaters of the type described. It is to be understood, however, that the heaters may be unregulated electrical resistance heaters; however, under such circumstances care must be taken that the board structure material and other components is not damaged by excessive heat.

In performing the soldering operations described hereinabove, solder or other fusible material is typically deposited on one or both of the contacts to be joined. Although solder is the preferred fusible electrically-conductive material for most applications of the present invention, other fusible materials may be employed. For example, several conductive adhesives and pastes are commercially available and are fabricated as suspensions of metal powder in a thermosetting plastic. The metal powders employed are typically gold, silver, copper, aluminum, etc., while the adhesive plastic is typically an epoxy-type resin.

From the foregoing description it will be appreciated that the present invention makes available a novel method and apparatus for joining different types of conductors to contact pads or traces on a structure such as a circuit board using a heater that is permanently secured to that board. In the preferred embodiment of the invention, the heater is a self-regulating heater of the type described.

Having described preferred embodiments of a new and improved method and apparatus for connecting various conductors to contact pads or traces on a circuit board, or the like, it is believed that other modifications, variations and changes will be suggested to those skilled in the art in view of the teachings set forth herein. It is to be understood that all such variations, modifications and changes are believed to fall within the scope of the present invention as defined by the appended claims.

We claim:

1. An article containing portions to be heated by delivery of sufficient thermal energy to at least one connection site to melt electrically-conductive fusible material at the connection site, said apparatus comprising:

a support structure comprising an electrically-insulative thermally conductive circuit board having first and second opposite board surfaces spaced by a board thickness dimension, with at least one contact pad secured to said circuit board at said connection site, said pad being disposed on said first board surface;

a selectively energizable self-regulating heater for generating said sufficient thermal energy, said heater having a thermally-conductive portion permanently secured to said support structure in spaced proximity to said connection site to permit thermal energy generated by said heater to be conducted to said connection site through the circuit board, said heater having a substrate of electrically and thermally conductive non-magnetic substrate material having first and second opposite surfaces, the substrate disposed over the entirety of said second surface of said circuit board and secured to said circuit board with the second substrate surface against the second board surface, a surface layer of magnetic surface layer material affixed to said substrate on less than the entirety of said first substrate surface, said surface layer aligned with said pad through the thickness of said circuit board, said surface layer material being electrically and thermally conductive but having a much greater electrical resistance than said substrate material, wherein said self-regulating heater is energizable by passing a constant amplitude alternating current of known frequency therethrough and the depth of said surface layer on said first surface of said substrate is approximately one skin depth at said known frequency, whereby current through said heater is concentrated in said surface layer at temperatures below the Curie temperature of said surface layer material and expands into said substrate material at temperatures equal to and above said Curie temperature.

2. An article containing portions to be heated by delivery of sufficient thermal energy to at least one connection site to melt electrically-conductive fusible material at the connection site, said apparatus comprising:
- a support structure comprising an electrically-insulative thermally-conductive circuit board having first and second opposite board surfaces spaced by a board thickness dimension, with at least one contact pad secured to said circuit board at said connection site, said pad being disposed on said first board surface;
- a selectively energizable self-regulating heater for generating said sufficient thermal energy, said heater having a thermally-conductive portion permanently secured to said support structure in spaced proximity to said connection site to permit thermal energy generated by said heater to be conducted to said connection site through the circuit board, said heater having a substrate of electrically and thermally conductive non-magnetic substrate material having first and second opposite surfaces, the substrate disposed over less than the entirety of said second surface of said circuit board and secured to said circuit board with the second substrate surface against the second board surface, a surface layer of at least a part of said first substrate surface, said surface layer aligned with said pad through the thickness of said circuit board, said surface layer material being electrically and thermally conductive but having a much greater electrical resistance than said substrate material, wherein said self-regulating heater is energizable by passing a constant amplitude alternating current of known frequency therethrough and the depth of said surface layer on said first surface of said substrate is approximately one skin depth at said known frequency, whereby current through said heater is concentrated in said surface layer at temperatures below the Curie temperature of said surface layer material and expands into said substrate material at temperatures equal to and above said Curie temperature.

3. The article according to claim 2 wherein said surface layer is disposed on the entirety of said first substrate surface.

4. The article according to claim 2 wherein said substrate material comprises copper.

5. The article according to claim 2 wherein said surface layer material comprises iron.

6. The article according to claim 2 wherein said substrate material comprises nickel.

7. An article containing portions to be heated by delivery of sufficient thermal energy to at least one connection site to melt electrically-conductive fusible material at the connection site, said apparatus comprising:
- the support structure comprising an electrically-insulative thermally-conductive circuit board having a plurality of board layers, the board layers being secured together in a stack, said circuit board having at least one contact pad secured to said circuit board at said connection site, said contact pad being disposed at one board layer and said heater being embedded within said stack at a different board layer;
- a selectively energizable self-regulating heater for generating said sufficient thermal energy, said heater having a thermally conductive portion secured to said support structure in spaced proximity to said connection site to permit thermal energy generated by said heater to be conducted to said connection site through at least one circuit board layer, said heater having a substrate of electrically and thermally conductive non-magnetic substrate material having first and second opposite surfaces;
- a surface layer of magnetic surface layer material affixed to said substrate on at least a part of said first surface, said surface layer being electrically and thermally conductive but having a much greater electrical resistance than said substrate material, wherein said self-regulating heater is energizable by passing a constant amplitude alternating current of known frequency therethrough and wherein the depth of said surface layer on said first surface of said substrate is approximately one skin depth at said known frequency;
- an electrically-conductive return bus embedded in said stack in closely-spaced proximity to said surface layer;
- a source of said alternating current; and
- means connecting said return bus and heater in series across said source such that current at any instant of time is in opposite direction through said return bus and said heater, whereby an electric field is established between said heater and said return bus to concentrate current flow at said first surface of said heater.

8. The article according to claim 7 wherein said structure includes at least top, bottom and intermediate board layers, said top board layer having an exposed top surface, wherein said contact pad is disposed on said top surface, and wherein said heater is disposed in said intermediate board layer.

9. The article according to claim 8 further comprising terminal means extending from said top surface through said top board layer into electric connection with said heater at said intermediate board layer to supply said alternating current to said heater.

10. The article according to claim 8 wherein said bottom board layer includes an exposed bottom surface, said apparatus further comprising terminal means extending from said bottom surface through said bottom board layer into electrical connection with said heater at said intermediate board layer to supply said alternating current to said heater.

11. The article according to claim 8 further comprising:
- an electrically-conductive return bus embedded in said stack and surrounded by said structure material, said return bus being disposed in closely spaced proximity to said surface layer of said substrate such that said structure material is disposed between said return bus and said surface layer;
- a source of said alternating current; and
- means connecting said return bus and heater in series across said source such that current at any instant of time is in opposite directions through said return bus and said heater, whereby an electric field is established between said heater and said return bus to concentrate current flow at said first surface of said heater.

12. An article containing portions to be heated by delivery of sufficient thermal energy to at least one connection site to melt electrically-conductive fusible material at the connection site, said apparatus comprising:
- a support structure comprising an electrically insulative thermally-conductive structure material;
- at least one contact pad secured to said support structure at said connection site;
- a selectively energizable self-regulating heater for generating said sufficient thermal energy, said heater embedded within said support structure and entirely surrounded by said structure material, said heater having a thermally-conductive portion permanently secured to said support structure in spaced proximity to said connection site to permit thermal energy generated by said heater to be conducted to said connection site through the structure material, said heater having a substrate of electrically and thermally conductive non-magnetic substrate material having first and second opposite surfaces;
- a surface layer of magnetic surface layer material affixed to said substrate on at least a part of said first surface, said surface layer material being electrically and thermally conductive but having a much greater electrical resistance than said substrate material, wherein said self-regulating heater is energizable by passing a constant amplitude alternating current of known frequency therethrough and wherein the depth of said surface layer on said first surface of said substrate is approximately one skin depth at said known frequency;
- an external return bus adapted to be placed in closely-spaced proximity to said surface layer with said structure material disposed between said return bus and said surface layer;
- a source of said alternating current; and
- means connecting said return bus and heater in series across said source such that current at any instant of time is in opposite directions through said return bus and said heater when the return bus is in closely-spaced proximity to said surface layer, whereby an electric field is established between said heater and said return bus to concentrate current flow at said first surface of said heater.

13. The article according to claim 12 wherein said surface layer faces away from said pad contact, and wherein said heater is disposed between said contact pad and said return bus when said return bus is in said closely-spaced proximity to said surface layer.

14. The article according to claim 12 wherein said surface layer faces toward said contact pad, and wherein said electrical contact is disposed between said return bus and said heater when said return bus is in said closely-spaced proximity to said surface layer.

15. Apparatus comprising:
- a circuit board composed of electrically-insulative and thermally-transmissive board material and having at least one surface;
- a plurality of electrical contacts disposed on said one surface;
- a selectively energizable heater embedded in said circuit board in sufficiently close proximity to said contacts to melt solder or other electrically-conductive fusible material at said contacts when the heater is energized, said heater having a substrate of an electrically-conductive first material having a relatively low electrical resistivity and relatively low magnetic permeability, said substrate having at least a first surface, and a surface layer of an electrically-conductive second material disposed on at least a portion of said first surface of said substrate, said second material having a higher electrical resistivity than that of said first material and having a magnetic permeability which at temperatures below its Curie temperature is substantially greater than said relatively low magnetic permeability and at temperatures above its Curie temperature is substantially the same as said relatively low magnetic permeability;
- exposed terminal means secured to said circuit board and extending through said board material to conduct energizing current to said heater; and
- a current return path disposed in spaced parallel relation to said first surface of said substrate, externally of said structure, and connected in series with said substrate such that current flow through said substrate and said return path at any instant of time is in opposite directions whereby to create an electric field between the return path and substrate that causes current in said substrate to be drawn toward the first surface of said substrate.

16. Apparatus comprising:
- a circuit board composed of electrically-insulative and thermally-transmissive board material and having at least one surface;
- a plurality of electrical contacts disposed on said one surface;
- a selectively energizable heater embedded in said circuit board in sufficiently close proximity to said contacts to melt solder or other electrically-conductive fusible material at said contacts when the heater is energized, said heater having a substrate of an electrically-conductive first material having a relatively low electrical resistivity and relatively low magnetic permeability, said substrate having at least a first surface and a surface layer of an electrically-conductive second material disposed on at least a portion of said first surface of said substrate, said second material having a higher electrical resistivity than that of said first material and having a magnetic permeability which at temperatures below its Curie temperature is substantially greater than said relatively low magnetic permeability and at temperatures above its Curie temperature is substantially the same as said relatively low magnetic permeability;
- exposed terminal means secured to said circuit board and extending through said board material to conduct energizing current to said heater; and
- a current return path disposed in spaced parallel relation to said first surface of said substrate, and connected in series with said substrate such that current flow through said substrate and said return path at any instant of time is in opposite directions whereby to create an electric field between the return path and substrate that causes current in said substrate to be drawn toward the first surface of said substrate.

17. An article containing portions to be heated by delivery of sufficient thermal energy to at least one connection site to melt electrically-conductive fusible material at the connection site, said apparatus comprising:
- the support structure comprising an electrically-insulative thermally-conductive circuit board having at least top, bottom and intermediate board layers, said top board layer having an exposed top surface, wherein said electrical contact is disposed on said top surface, and wherein said heater is disposed in said intermediate board layer, the board layers being secured together in a stack, said circuit board having at least one contact pad secured to said circuit board at said connection site, said contact pad being disposed at one board layer and said heater being embedded within said stack at a different board layer;

a selectively energizable self-regulating heater for generating said sufficient thermal energy, said heater embedded within said support structure and entirely surrounded by said structure material, said heater having a thermally conductive portion secured to said support structure in spaced proximity to said connection site to permit thermal energy generated by said heater to be conducted to said connection site through at least one circuit board layer, said heater having a substrate of electrically and thermally conductive non-magnetic substrate material having first and second opposite surfaces;

a surface layer of magnetic surface layer material affixed to said substrate on at least a part of said first surface, said surface layer being electrically and thermally conductive but having a much greater electrical resistance than said substrate material, wherein said self-regulating heater is energizable by passing a constant amplitude alternating current of known frequency therethrough and wherein the depth of said surface layer on said first surface of said substrate is approximately one skin depth at said known frequency;

an electrically-conductive return bus embedded in said stack and surrounded by said structure material, said return bus being disposed in closely spaced proximity to said surface layer of said substrate such that said structure material is disposed between said return bus and said surface layer;

a source of said alternating current; and means connecting said return bus and heater in series across said source such that current at any instant of time is in opposite directions through said return bus and said heater, whereby an electric field is established between said heater and said return bus to concentrate current flow at said first surface of said heater.

18. The article according to claim 17 wherein said heater and said return bus are disposed on opposite surfaces of said intermediate layer.

19. An article containing portions to be heated by delivery of sufficient thermal energy to at least one connection site to melt electrically-conductive fusible material at the connection site, said apparatus comprising:

a support structure comprising an electrically-insulative thermally-conductive circuit board having first and second opposite board surfaces spaced by a board thickness dimension with at least one contact pad secured to said circuit board at said connection site, said pad being disposed on said first board surface;

a selectively energizable self-regulating heater for generating said sufficient thermal energy, said heater having a thermally-conductive portion permanently secured to said circuit board in spaced proximity to said connection site to permit thermal energy generated by said heater to be conducted to said connection site through the circuit board, said heater having a substrate of electrically and thermally conductive non-magnetic substrate material having first and second opposite surfaces, the substrate secured to said circuit board with the second substrate surface against the second board surface and with said heater in substantial alignment with said pad through the board thickness dimension;

a surface layer of magnetic surface layer material affixed to said substrate on at least a part of said first surface, said first surface layer material being electrically and thermally conductive but having a much greater electrical resistance than said substrate material, wherein said self-regulating heater is energizable by passing a constant amplitude alternating current of known frequency therethrough and the depth of said surface layer on said first surface of said substrate is approximately one skin depth at said known frequency;

external tooling means for selectively delivering said alternating current to said heater, said tooling means comprising:

an electrically-conductive return bus adapted for placement in closely-spaced proximity to said surface layer;

an electrically-insulative means adapted to be disposed between and in contact with said return bus and said surface layer;

a source of said alternating current; and means connecting said return bus and heater in series across said source such that current at any instant of time is in opposite directions through said return bus and heater when the return bus is in said closely spaced proximity with said surface layer, whereby an electric field is established between said heater and said return bus to concentrate current flow at said first surface of said heater.

* * * * *